(12) United States Patent
Mizuuchi et al.

(10) Patent No.: US 7,463,664 B2
(45) Date of Patent: Dec. 9, 2008

(54) COHERENT LIGHT SOURCE AND OPTICAL DEVICE

(75) Inventors: Kiminori Mizuuchi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 10/576,107

(22) PCT Filed: Mar. 15, 2005

(86) PCT No.: PCT/JP2005/004526

§ 371 (c)(1), (2), (4) Date: Apr. 18, 2006

(87) PCT Pub. No.: WO2005/099054

PCT Pub. Date: Oct. 20, 2005

(65) Prior Publication Data

US 2007/0133638 A1    Jun. 14, 2007

(30) Foreign Application Priority Data

Apr. 9, 2004   (JP) ............................. 2004-115277

(51) Int. Cl.
*H01S 5/00* (2006.01)
*H01S 3/10* (2006.01)
(52) U.S. Cl. ...................... 372/50.11; 372/22
(58) Field of Classification Search ............. None
See application file for complete search history.

(56) References Cited

U.S. PATENT DOCUMENTS

| | | | |
|---|---|---|---|
| 5,499,256 A * | 3/1996 | Bischel et al. | 372/20 |
| 5,845,030 A | 12/1998 | Sasaki et al. | |
| 6,388,799 B1 * | 5/2002 | Arnone et al. | 372/20 |
| 6,489,985 B1 * | 12/2002 | Brodsky et al. | 347/237 |
| 2003/0103544 A1 | 6/2003 | Sakai et al. | |

FOREIGN PATENT DOCUMENTS

| | | |
|---|---|---|
| EP | 1 152 504 | 11/2001 |
| EP | 1 318 580 | 6/2003 |
| JP | 4-287389 | 10/1992 |
| JP | 6-102553 | 4/1994 |
| JP | 8-264872 | 10/1996 |
| JP | 9-186387 | 7/1997 |
| JP | 9-283847 | 10/1997 |

(Continued)

OTHER PUBLICATIONS

Martin, Løbel et al. "Single-mode operation of a laser-diode array with frequency-selective phase-conjugate feedback", Optics letters, vol. 23, No. 11, pp. 825-827.

(Continued)

*Primary Examiner*—Minsun Harvey
*Assistant Examiner*—Sean Hagan
(74) *Attorney, Agent, or Firm*—Wenderoth, Lind & Ponack, L.L.P.

(57) ABSTRACT

Light emitted from a wide stripe semiconductor laser with increased output and efficiency is passed through a mode converter and a wavelength selecting filter, then fed back to the active layer of the semiconductor laser, which fixes the oscillation mode of the semiconductor laser to single mode, making lateral-mode control possible.

25 Claims, 8 Drawing Sheets

FOREIGN PATENT DOCUMENTS

| | | |
|---|---|---|
| JP | 10-27946 | 1/1998 |
| JP | 2000-305036 | 11/2000 |
| JP | 3146505 | 1/2001 |
| JP | 2001-284734 | 10/2001 |
| JP | 2002-76512 | 3/2002 |
| JP | 2002131567 A * | 5/2002 |
| JP | 2003-110192 | 4/2003 |
| JP | 2003-168844 | 6/2003 |

OTHER PUBLICATIONS

W. Nagengast et al., "High-power singe-mode emission from a broad-area semiconductor laser with a pseudoexternal cavity and a Fabry-Perot etalon", Optics letters, vol. 22, No. 16, pp. 1250-1252.

A Chinese Office Action (and an English translation thereof) regarding Chinese Application No. 200580004858.4, which is a foreign counterpart of the present application.

Martin, Løbel et al. "Single-mode operation of a laser-diode array with frequency-selective phase-conjugate feedback", Optics letters, vol. 23, No. 11, pp. 825-827, Jun. 1, 1998.

W. Nagengast et al., "High-power singe-mode emission from a broad-area semiconductor laser with a pseudoexternal cavity and a Fabry-Perot etalon", Optics letters, vol. 22, No. 16, pp. 1250-1252, Aug. 15, 1997.

A Chinese Office Action (and an English translation thereof) regarding Chinese Application No. 200580004858.4, which is a foreign counterpart of the present application, Oct. 26, 2007.

* cited by examiner

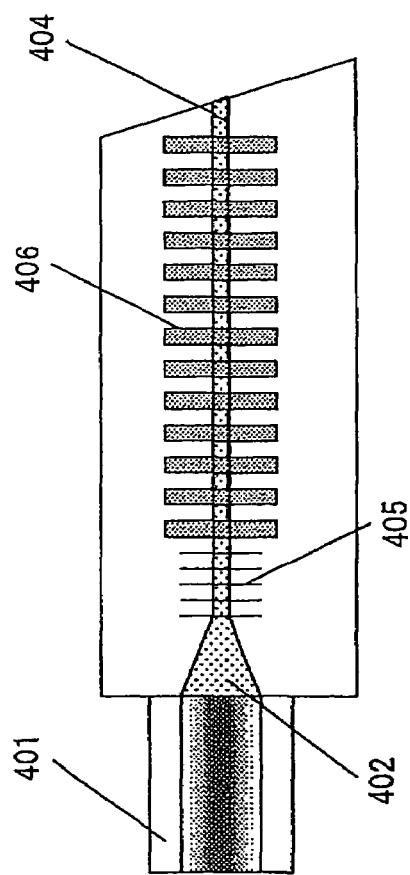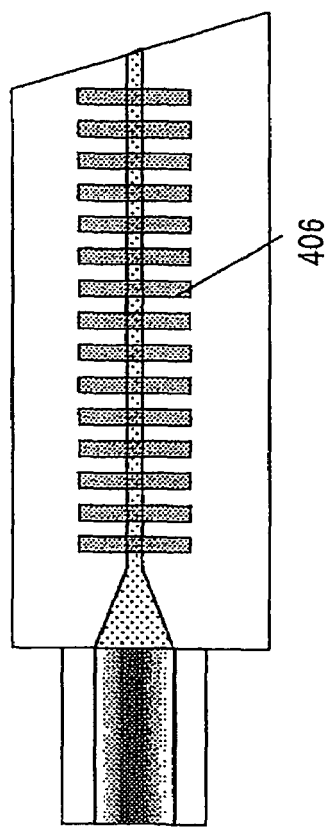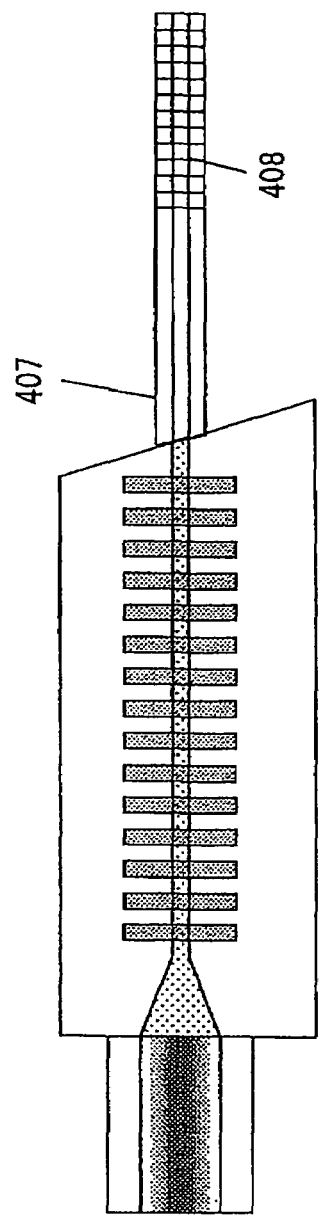

COHERENT LIGHT SOURCE AND OPTICAL DEVICE

TECHNICAL FIELD

The present invention relates to a coherent light source that makes use of an optical waveguide device, and to an optical device.

BACKGROUND ART

Semiconductor lasers are compact and have high output, and allow for highly efficient electro-optical conversion, with the conversion efficiency exceeding 40%. A semiconductor laser has an optical waveguide structure, and high efficiency is achieved by utilizing optical trapping within an optical waveguide. However, this trapping of light limits how much the output of a semiconductor laser can be increased. This is because when the power density in an optical waveguide rises, the power density near the exit portion also rises, which can lead to end face breakdown, and reliability also suffers. An effective way to solve this problem is to reduce the power density of the light of a semiconductor laser. Thus, the power density of light is reduced, and output is increased, by increasing the cross sectional area of the optical waveguide in which light is trapped. A semiconductor laser such as this is called a wide stripe semiconductor laser (hereinafter referred to as a semiconductor laser), and has high output characteristics ranging from a few hundred milliwatts to a few watts.

Meanwhile, it is difficult to keep the light that propagates through the optical waveguide in a semiconductor laser in single mode, and the electric field distribution of the light becomes non-uniform because of the presence of a number of multimodes. Also, with a semiconductor laser, unlike the single-mode semiconductor lasers ordinarily used in optical communications or optical disks, there is a large decrease in convergence characteristics. Also, because a plurality of modes are present, oscillation at a single wavelength is difficult. Consequently, coherence deteriorates both spatially and temporally, and application to single-mode fibers or optical waveguide devices has been difficult.

Providing optical feedback to a semiconductor laser has been proposed as a way to solve these problems. The waveguide mode of a semiconductor laser can be controlled by external optical feedback. For instance, it has been indicated that the oscillation wavelength of a semiconductor laser can be fixed by feeding back the light emitted from a semiconductor laser in a resonator of the semiconductor laser after subjecting the light to wavelength selection with a narrowband wavelength selecting filter or fiber grating (see Non-Patent Document 1, for example). Control of the lateral mode of a semiconductor laser is also possible, and a method has been proposed in which a semiconductor laser is oscillated in single mode by using a nonlinear mirror to return light from the outside (see Non-Patent Document 2, for example).

Non-Patent Document 1: Optics Letters, Vol. 22, No. 16, pp. 1250-1252 (1997)

Non-Patent Document 2: Optics Letters, Vol. 23, No. 11, pp. 825-827 (1998)

SUMMARY OF THE INVENTION

Nevertheless, with a method such as that in Non-Patent Document 1, since the optical waveguide structure of a high-output semiconductor laser is a wide stripe structure, the light that is generated assumes a multimode state not only in longitudinal mode, which affects the oscillation wavelength, but at the same time in lateral mode, which is the electric field distribution of the emitted light. With conventional optical feedback, single-mode oscillation can be achieved in longitudinal mode with a high-output wide stripe semiconductor laser such as this, but a problem has been that single-mode oscillation is impossible in lateral mode. Consequently, a problem has been that there is a dramatic decrease in coupling between a single-mode optical waveguide device and a semiconductor laser.

Meanwhile, with a method such as that in Non-Patent Document 2, since a nonlinear mirror is not very efficient, extremely high power is required to improve the efficiency. Moreover, the optical system is complicated, which has been a problem in terms of reducing the size and improving the stability of the system.

In view of this, the coherent light source of the present invention comprises a wide stripe semiconductor laser, a mode converter for beam shaping the light emitted from the semiconductor laser, a single-mode waveguide to which the light from the semiconductor laser is coupled through the mode converter, and a wavelength selecting filter that feeds back part of the light transmitted by the single-mode waveguide to the active layer of the semiconductor laser, wherein the oscillation mode of the semiconductor laser is limited by the light that has been fed back.

This affords highly efficient coupling between the semiconductor laser and the single-mode waveguide, and also affords high optical conversion efficiency.

Furthermore, in the coherent light source of the present invention, part of the light coupled to the single-mode waveguide is also reflected at the exit end face of the single-mode waveguide, and fed back to the active layer of the semiconductor laser.

Also, the wavelength selecting filter may include a band pass filter and a reflector, and light that has been transmitted by the single-mode waveguide goes through the band pass filter, and then part of it is reflected by the reflector and fed back to the active layer of the semiconductor laser.

This makes lateral-mode control of a wide stripe laser possible, and affords high coupling efficiency with the single-mode waveguide.

The band pass filter and the reflector may be formed integrally with the single-mode waveguide as a Bragg reflection grating.

Also, the wavelength selecting filter may be constituted by a volume grating, or may be a fiber grating.

These also make lateral-mode control of a wide stripe laser possible.

Also, the wavelength selecting filter may be formed integrally with the semiconductor laser as a Bragg reflection grating.

This enhances the effect of Bragg diffraction, and increases the speed of output modulation of the semiconductor laser.

In the coherent light source of the present invention, the mode converter may be a tapered waveguide. It may also be a tapered fiber.

These make it possible to generate high-output single-mode light.

In the coherent light source of the present invention, the single-mode waveguide has a periodic polarization inversion structure, and part of the light from the semiconductor laser is subjected to wavelength conversion by the polarization inversion structure.

This allows the wavelength to be converted at high efficiency.

The coherent light source of the present invention comprises a wide stripe semiconductor laser, a tapered waveguide having an incident end face to which light from the semiconductor laser is coupled, a single-mode waveguide formed on the exit end face side of the tapered waveguide, a band pass filter that transmits part of the light from the single-mode waveguide, and a reflector that reflects the light transmitted by the band pass filter and feeds this light back to the active layer of the semiconductor laser. The oscillation mode of the semiconductor laser is limited by the light that has been fed back.

This makes lateral-mode control of a wide stripe laser possible, and affords high coupling efficiency with the single-mode waveguide.

The band pass filter may be formed integrally with the single-mode waveguide as a Bragg reflection grating.

Also, the single-mode waveguide is composed of a nonlinear optical material and has a periodic polarization inversion structure, and part of the light from the semiconductor laser is subjected to wavelength conversion by the polarization inversion structure.

This allows the wavelength to be converted at high efficiency.

The single-mode waveguide is composed of a nonlinear optical material and has a periodic polarization inversion structure, and part of the light from the semiconductor laser is subjected to wavelength conversion by the polarization inversion structure.

This allows the wavelength to be converted at high efficiency.

Also, the exit end face of the single-mode waveguide has a dichroic mirror that transmits fundamental waves and transmits higher harmonic waves.

This allows higher harmonic waves to be taken off outside of the coherent light source.

The active layer width of the wide stripe semiconductor laser is preferably 100 μm or less.

This ensures coupling between the semiconductor laser and an optical waveguide device.

The lateral mode of the semiconductor laser is substantially fixed to single-mode oscillation by reflected light from the wavelength selecting filter.

This makes single-mode oscillation possible even in lateral mode.

The optical device of the present invention has an image conversion optical system and any of the above-mentioned coherent light sources, wherein light from the coherent light source is converted by the optical system into a two-dimensional image.

The image conversion optical system preferably has a two-dimensional beam scanning optical system, and preferably has a two-dimensional switch.

As above, the present invention is such that a wide stripe semiconductor laser is controlled by optical feedback so that the longitudinal mode and lateral mode are at the same time in an oscillation state that is close to single mode, to achieve highly efficient coupling with a single-mode waveguide.

BRIEF DESCRIPTION OF THE DRAWINGS

FIG. 6 consists of diagrams of structural examples of the coherent light source pertaining to a third embodiment of the present invention;

NUMERICAL REFERENCE

Figure 1:
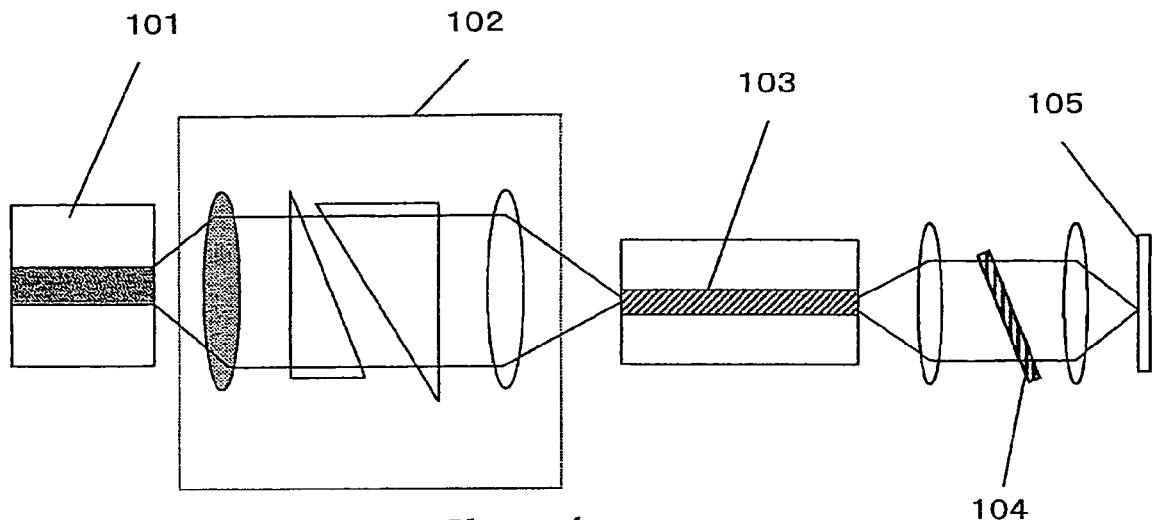
FIG. 1 is a diagram of an example of the structure of the coherent light source pertaining to a first embodiment of the present invention.

101, 301, 401, 501, 601, 701 semiconductor laser
102 mode converter
103, 304, 404, 509, 605, 704 single-mode waveguide
104, 510, 610 band pass filter
105, 513, 902, 903 reflector
120, 620 volume grating
300 optical waveguide device
303, 402, 503, 604, 703 tapered waveguide
305, 405, 408, 708 Bragg reflection grating
406, 506, 603 polarization inversion
407, 707 fiber
511, 611 dichroic mirror
512 higher harmonic wave
606 reflective film
709 tapered fiber
801, 901 light source
802 two-dimensional switch
803 prism
804 lens
805 RGB laser
807 diffraction element
904 laser beam
905 screen

DESCRIPTION OF THE EMBODIMENTS

There are two advantages to being able to oscillate a wide stripe semiconductor laser in single mode. First, coupling is more efficient between the semiconductor laser and a single-mode optical waveguide device. A wide stripe semiconductor laser has a higher output than a red semiconductor laser. For example, the output (CW output) of a red semiconductor laser with a wavelength of 650 to 680 nm is about 70 mW, about 150 mW in the 800 nm band, and about 500 mW in the 980 nm band. In contrast, the output of a wide stripe semiconductor laser ranges from a few hundred milliwatts to a few watts, which is at least one order of magnitude larger than with a red semiconductor laser. However, when coupling with a single-mode waveguide is considered, a wide stripe semiconductor laser becomes virtually unusable. With a single-mode semiconductor laser, coupling with a single-mode waveguide at a high efficiency of 50 to 80% is possible, but with a wide stripe semiconductor laser, a coupling efficiency of just a few percent is the best that can be attained. Since increasing the output of a semiconductor laser is affected by the cross sectional area of the optical waveguide, the lateral mode poses a limit to how high the output of a single-mode semiconductor laser can be raised. Furthermore, since the lateral mode of a wide stripe semiconductor laser tends to fluctuate, coupling with an optical waveguide also fluctuates greatly and results in instability. In contrast, the constitution of the present invention allows a wide stripe semiconductor laser and a single-mode optical waveguide device to be coupled at high efficiency, so high-output light can be guided to the single-mode waveguide of an optical waveguide device. Furthermore, since the coupling state of the optical waveguide and the wavelength of the semiconductor laser can be kept stable, low noise and stable characteristics can be achieved.

The second advantage is that a high-output single-mode semiconductor laser light source can be obtained. Deterioration of the end face of a semiconductor laser is something else that hampers raising the output of a semiconductor laser. When the power density of light guided through a semiconductor laser increases, deterioration of the end face occurs as a result of optical breakdown near the end face of the semiconductor laser. This is caused by heat generated by the slight optical absorption by the crystals that make up the semiconductor laser. The wide stripe semiconductor laser was devised to reduce power density and make higher output possible by enlarging the optical waveguide size of a semiconductor laser in order to prevent this optical breakdown. However, since a wide stripe semiconductor laser is multimode for both longitudinal mode and lateral mode, there is a large amount of noise and coupling deteriorates, leading to instability. In contrast, the constitution of the present invention is primarily such that light that has simultaneously undergone wavelength selection and mode selection is fed back to a semiconductor laser. More specifically, the light emitted from the semiconductor laser undergoes wavelength selection and mode selection by a wavelength selecting filter and a mode converter that controls the lateral mode, after which the light is fed back to the active layer. An example of a coherent light source in which this phenomenon is utilized will now be described in detail.

First Embodiment

FIG. 1 is a diagram of the structure of the coherent light source of the present invention. The light emitted from a semiconductor laser 101 is beam shaped by a mode converter 102 and is then incident on a single-mode waveguide 103. Part of the light that has passed through the optical waveguide of the single-mode waveguide 103 passes through a band pass filter 104, after which it is reflected by a reflector 105, and is fed back through the same exit path to the active layer of the semiconductor laser 101. Part of the light coupled to the single-mode waveguide 103 is also reflected at the exit end face of the single-mode waveguide and fed back to the active layer of the semiconductor laser. The band pass filter 104 and reflector 105 here constitute a wavelength selecting filter.

Figure 2A:
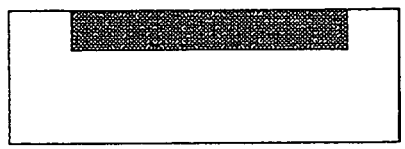
FIG. 2a is a cross section of the wide stripe semiconductor laser pertaining to the present invention.
Figure 2B:
FIG. 2b is a graph of the field intensity distribution of a wide stripe semiconductor laser during multimode oscillation.

In the case of a wide stripe laser, since the lateral mode is a multimode, the near field pattern (NFP) of the outputted light has the intensity distribution shown in FIG. 2b. In general, a mode converter is effective on light in which the lateral mode is a single mode, but light having the random intensity distribution shown in FIG. 2b cannot be formed in a shape close to the propagating beam of a single-mode waveguide. Consequently, even though the light passes through the mode converter 102, the coupling efficiency between the semiconductor laser 101 and the single-mode waveguide 103 is 10% or less. In contrast, when the light that has passed through the band pass filter and the mode converter is fed back, an NFP is formed in the shape shown in FIG. 2c. As a result, the light converted by the mode converter 102 can be coupled to the single-mode waveguide 103 at a high efficiency of at least 50%. Specifically, the lateral mode of a wide stripe laser can be controlled by feeding back the light through the mode converter 102 and the band pass filter 104, affording higher efficiency coupling with a single-mode waveguide.

Next, the principle by which high efficiency coupling is realized with the constitution of this embodiment will be described. An ordinary Fabry-Perot semiconductor laser (hereinafter referred to as FP-LD) has a wide gain. For example, with a single-mode FP-LD, the lateral mode that propagates through the optical waveguide is fixed (single-mode), but oscillation is possible over a wide range of gain wavelength. The gain and loss of a semiconductor laser are what determine this oscillation wavelength. A semiconductor laser oscillates at a wavelength with the greatest gain and the least loss. Methods in which the oscillation wavelength of a semiconductor laser are varied with grating feedback or the like take advantage of this characteristic. If a specific wavelength (within the gain range) is fed back in the wide wavelength region over which the semiconductor laser is capable of oscillating, light of the feedback wavelength increases in the resonator, so there is an apparent reduction in the propagation loss of the feedback wavelength compared to other wavelengths. This fixes the feedback wavelength, with the least loss, at the oscillation wavelength of the semiconductor laser.

The constitution of the present invention lies in proposing a method for controlling the lateral mode and longitudinal mode of a wide stripe FP-LD by utilizing the principle that the oscillation of a semiconductor laser is determined by the relation between loss and gain. Since a wide stripe FP-LD has a wide optical waveguide width, the lateral mode is a multimode. Accordingly, the longitudinal mode and lateral mode both have a wide oscillation range. The oscillation wavelength, longitudinal mode, and lateral mode of a wide stripe laser can be controlled by selectively providing optical feedback to a specific lateral mode and a specific wavelength to the semiconductor laser.

The lateral mode is the same as the oscillation mode in that the lateral mode of a semiconductor laser can be selectively excited by designing the laser such that the strongest optical feedback is applied when the lateral mode is oscillated in single mode. Accordingly, feedback through a mode converter is effective for the lateral mode. A mode converter consists of a combination of prisms, and serves to match the oscillation mode having a large aspect ratio of a wide stripe laser to the aspect ratio of a single-mode waveguide. With a mode converter, the highest efficiency of coupling with a single-mode waveguide can be achieved when the lateral mode of a semiconductor laser is oscillated in single mode. Therefore, when the lateral mode of a semiconductor laser is oscillated in single mode, coupling with a single-mode waveguide is the strongest, and the coupled light passes through the optical waveguide, is reflected by an external reflector, and is fed back again to the semiconductor laser. Specifically, the power density within the semiconductor laser active layer is highest when the oscillation of a semiconductor laser is in single mode. Accordingly, this results in a state in which the lateral mode of the semiconductor laser selectively excites the single mode.

Modification 1

The structure may be such that a periodic polarization inversion structure is formed in the single-mode waveguide, and part of the light from the semiconductor laser is subjected to wavelength conversion.

Modification 2

The structure may be such that a dichroic mirror is installed between the single-mode waveguide and the band pass filter. Here, the light whose wavelength has been converted to a higher harmonic wave is reflected by the dichroic mirror and emitted to the outside. This operation will be described in detail in a later embodiment.

Modification 3

Figure 3A:
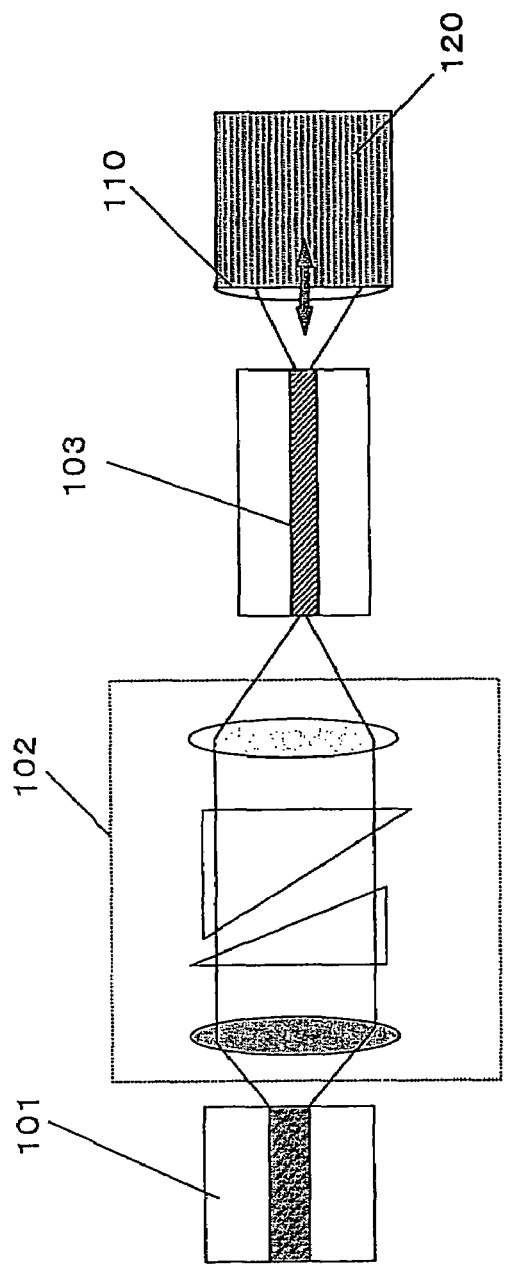
FIG. 3 consists of diagrams illustrating other structural examples of the coherent light source pertaining to the first embodiment of the present invention.
Figure 3B:
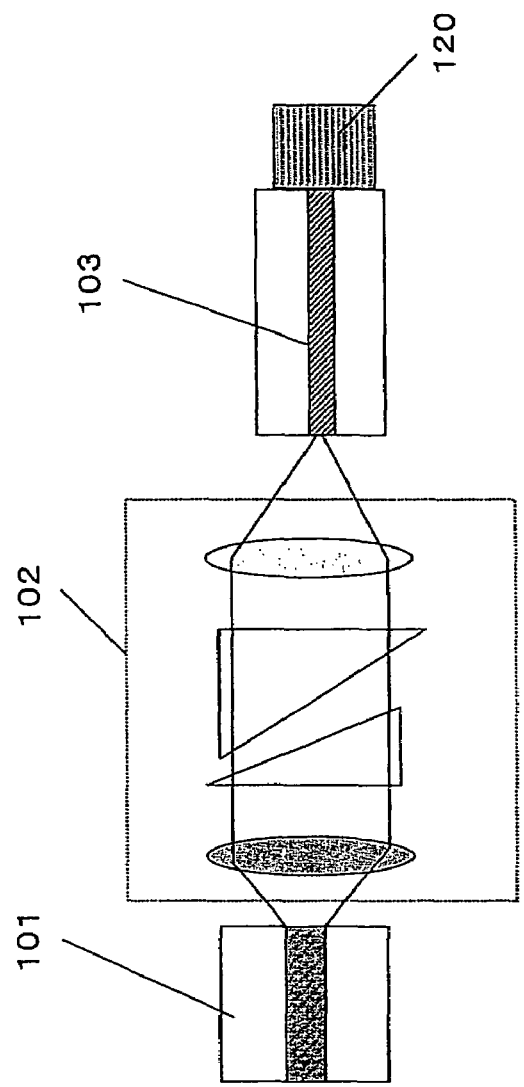

The wavelength selecting filter may be constituted by a volume grating. FIG. 3 shows an example of this. FIG. 3a is an example of disposing a volume grating 120 via the collimating lens 110, and FIG. 3b is an example of directly coupling the single-mode waveguide 103 and the volume grating 120.

Figure 4:
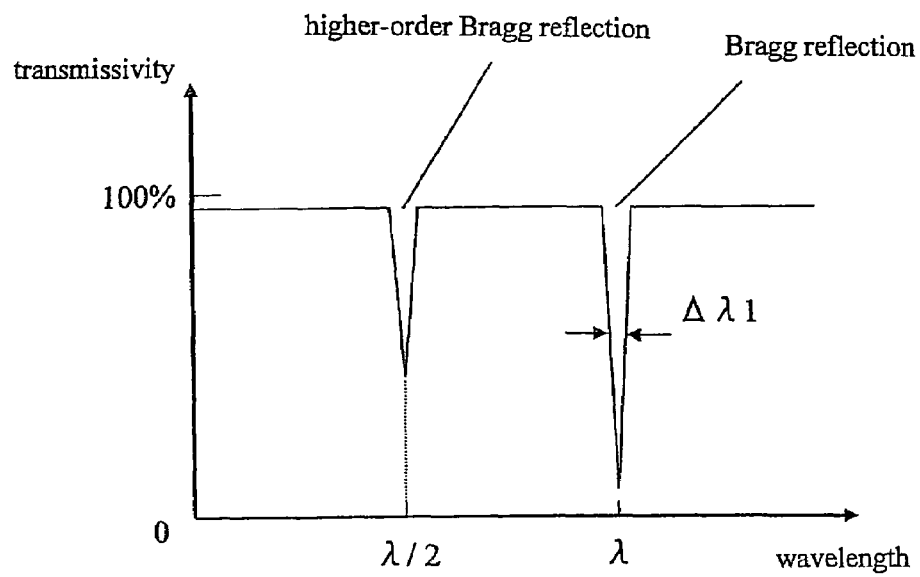
FIG. 4 is a graph of the transmission characteristics of the volume grating pertaining to the present invention.

A volume grating is a bulk material having a periodic change in refractive index. It is composed of a material whose main component is a UV-curing material, and the interference of light is utilized to form a grating structure. Bragg reflection produced by a periodic refractive index grating formed in bulk results in narrow-band reflection characteristics with a narrow half band width. FIG. 4 shows the transmission characteristics of a volume grating. Narrow-band reflection characteristics produced by Bragg reflection are exhibited in the vicinity of the phase matching wavelength $\lambda$ of the wavelength conversion element. To fix the wavelength of a semiconductor laser, the half band width $\Delta\lambda 1$ of Bragg reflection is preferably 0.6 nm or less. A band width of 0.2 nm or less is even better. A band width of 0.2 nm or less will stabilize the wavelength of the semiconductor laser and yield stable output characteristics when wavelength conversion or the like is utilized.

Furthermore, when a wavelength conversion element is used in combination, higher-order Bragg reflection must also be taken into account. As shown in FIG. 4, higher-order Bragg reflection is generated near $\lambda/2$ as a higher-order mode of the volume grating. To be utilized in the constitution of the present invention, the narrow-band reflection characteristics with respect to light with a wavelength $\lambda$ must be transparent to a wavelength of $\lambda/2$, which is a higher harmonic wave. To this end, the wavelength of the higher harmonic wave and the reflection of close to $\lambda/2$, which is higher-order Bragg reflection, has to be shifted very slightly. This is preferably accomplished by using the refractive index distribution of the material that makes up the volume grating. This makes it possible to use a material with a large refractive index distribution and to vary the refractive index of the wavelength $\lambda$ and the wavelength $\lambda/2$, and allows the Bragg reflection wavelength to be shifted. Since the half band width of the phase matching wavelength tolerance of the wavelength conversion element is 0.1% of the phase matching wavelength, the difference $(n2-n1)/n1$ between the refractive index n1 of the volume grating with respect to light with a wavelength $\lambda$ and the refractive index n2 with respect to a wavelength $\lambda/2$ is preferably at least 0.2%. This allows the wavelength of the higher harmonic wave and the higher-order Bragg reflection to be shifted. The difference is even more preferably at least 0.5%. A refractive index difference of at least 0.5% will eliminate almost all of the effect of higher-order Bragg reflection.

Second Embodiment

However, it was found that the single mode could not be sufficiently excited with just the mode converter discussed in Embodiment 1. With a wide stripe semiconductor laser, a plurality of longitudinal modes are present in addition to the lateral mode, so there are a plurality of lateral modes of different wavelength, and the total number of modes including longitudinal and lateral modes is extremely large. In this state, a large difference in loss compared to other modes cannot be obtained with just a mode converter. The oscillation state of a semiconductor laser is fixed in the state with the least loss, but when there is little difference in the loss and gain conditions for a plurality of modes, the result is an unstable state in which a plurality of modes are present. To selectively excite just one of these modes, a state in which the loss is sufficiently lower than with the other modes, that is, a state in which the feedback with respect to a specific mode is sufficiently larger than the other modes, is necessary. This problem is solved in this embodiment by fixing the oscillation wavelength of the semiconductor laser and at the same time providing lateral mode selectivity, which limits the number of lateral modes that can be oscillated and results in a stable lateral mode single oscillation.

Figure 5:
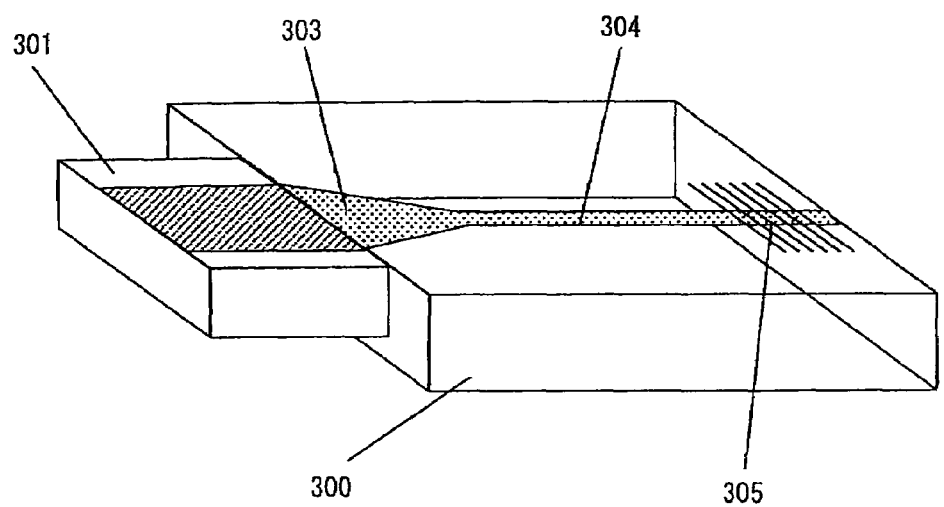
FIG. 5 is a diagram of a structural example of the coherent light source pertaining to a second embodiment of the present invention.

FIG. 5 is an example of the coherent light source of this embodiment, in which this principle is put to use. An optical waveguide device 300 is constituted by a tapered waveguide 303 coupled to the exit side of the wide stripe semiconductor laser 301, and a single-mode waveguide 304. A wavelength selecting filter is integrated as a Bragg reflection grating 305 in the single-mode waveguide 304. The light emitted from the semiconductor laser 301 is coupled to the tapered waveguide 303, after which it propagates through the single-mode waveguide 304. The light coupled to the single-mode waveguide 304 is reflected by the Bragg reflection grating 305 and fed back to the semiconductor laser 301. The lateral mode of the semiconductor laser 301 is automatically fixed in the mode of the greatest feedback. Specifically, when the light goes from the semiconductor laser 301 through the tapered waveguide 303 and is coupled at its maximum to the single-mode waveguide 304, the reflected light from the Bragg reflection of the single-mode waveguide 304 is at its maximum, and the optical feedback of the semiconductor laser 301 is at its largest. Accordingly, the oscillation lateral mode of the semiconductor laser 301 is automatically fixed in the mode that best couples to the single-mode waveguide 304.

A material that is transparent to the oscillation wavelength of the semiconductor laser is used as the material of the tapered waveguide. Examples include substances with high transparency such as $LiNbO_3$, $LiTaO_3$, $SiO_2$, GaN, and $Al_2O_3$. The power of the guided light is extremely high at the exit end face of the tapered waveguide, but end face deterioration can be prevented by using a material with low absorption.

Figure 2C:
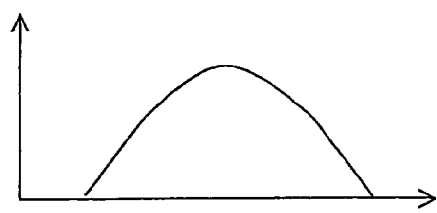
FIG. 2c is a graph of the field intensity distribution of a wide stripe semiconductor laser during single-mode oscillation.

Analysis of the optical waveguide modes revealed that a case in which the lateral mode of a semiconductor laser is very close to a single mode is when coupling with the single-mode waveguide through the tapered waveguide is greatest. FIG. 2 shows the field intensity distribution of the lateral mode (width direction) at the end face of a wide stripe FP-LD. In an ordinary state, the lateral mode shown in FIG. 2b oscillates in multimode. In contrast, when the constitution of the present invention is adopted, it can be seen that the lateral mode shown in FIG. 2c oscillates very close to single mode.

Also, the guided light that propagates through a single-mode waveguide has just one field distribution state, so the effective refractive index is determined unambiguously.

Accordingly, there is only one mode reflected by the Bragg reflection grating, and the wavelength and mode fed back to the semiconductor laser are each fixed to just one. Thus, the oscillation of the semiconductor laser is in a nearly single state for both longitudinal and lateral modes, resulting in extremely stable operation.

As discussed above, a high-output single-mode light source can be obtained by employing a hybrid structure of a tapered waveguide and a wide stripe semiconductor laser. Also, by utilizing Bragg reflection it is possible to fix both the longitudinal and lateral modes in a single-mode state, which affords a stable light source with low noise, high output, and lateral and longitudinal single modes.

A structure such as this is advantageous to increasing output. As mentioned above, with a semiconductor laser, increasing the power density within the optical waveguide leads to end face breakdown, diminished reliability, and so forth, making it difficult to raise output in single mode. In contrast, a dielectric optical waveguide has little loss and excellent high output resistance. It is also easy to control the refractive index and so on, so a relatively large single-mode waveguide can be formed. Accordingly, if single-mode oscillation is possible with an optical waveguide, a high-output coherent light source of high beam quality can be obtained. Furthermore, a highly functional element can be obtained by integrating functional elements in an optical waveguide.

Also, coupling an optical waveguide with a semiconductor laser creates the problem that compound cavities are formed. A compound cavity is composed of a resonator constituted by the two end facts of the semiconductor laser and a resonator including a Bragg reflector. A resonator is also constituted by the end face reflection of the optical waveguide. Since the oscillation mode becomes unstable if there are a plurality of resonators, it is preferable for the exit end face of the optical waveguide to be inclined to prevent reflection from the exit end face.

Reflectivity at the exit end face of the semiconductor laser on the side coupled to the optical waveguide is preferably kept to 1% or less in order to adequately feed back return light from the Bragg reflector to inside the active layer.

Meanwhile, the resonation between the Bragg reflection and the resonator of the semiconductor laser increases the selectivity of the longitudinal mode. Because the resonator length of the semiconductor laser is short, the longitudinal mode spacing is relatively wide. Consequently, even if the width of the reflection spectrum of the Bragg reflector is about a few angstroms, the longitudinal mode can still be controlled adequately. Also, the oscillation wavelength can be put in a narrower band because the resonator of the semiconductor laser and the resonator with the Bragg reflector form a compound resonator structure.

With the above constitution of the present invention, light from the semiconductor laser was taken off from a single-mode waveguide, but it is also possible for the light to be emitted from the rear end face side of the semiconductor laser. In this case, the reflectivity of the Bragg reflector must be at least 50% and the light must be taken off efficiently from the semiconductor laser side. A high-output single-mode excitation semiconductor laser can be constituted by integrating waveguide elements into a semiconductor laser.

The active layer width of the wide stripe semiconductor laser is preferably 100 µm or less. The "active layer width" here is defined the same as the wide stripe width. Since the width of a single-mode waveguide is from a few microns to about a few dozen microns, if there is too much difference between the width of the single-mode waveguide and the mode width of the semiconductor laser, there will be a drop in the conversion efficiency of the single-mode waveguide constituted by the tapered waveguide. A width of ~20 µm or less is even better. At 20 µm or less, coupling with a single-mode waveguide will be possible at an efficiency of 80% or higher.

Third Embodiment

In this embodiment, an example of applying the constitution of the present invention to a wavelength conversion element will be described.

A wavelength conversion element that utilizes a nonlinear optical effect can convert semiconductor laser light into a short-wavelength higher harmonic wave. This means that raising the output is easier, and a compact, high-output, short-wavelength light source can be obtained using a highly reliable red semiconductor laser.

One wavelength conversion element capable of highly efficient conversion is a pseudo-phase matching type of wavelength conversion element composed of a periodic polarization inversion structure. Nonlinear optical materials include magnesium-doped $LiNbO_3$, $LiTaO_3$, $KTiOPO_4$, and so forth. Any wavelength conversion is possible, and highly efficient conversion can be performed, by varying the polarization inversion structure. Even higher conversion efficiency can be attained by using an optical waveguide structure. However, a wavelength conversion element has extremely narrow tolerance for the wavelengths that can be converted. For instance, in the case of an element length of about 10 mm, the wavelength tolerance is about 0.1 nm. Accordingly, the wavelengths that can be converted must have an oscillation spectrum of 0.1 nm or less, and a single-mode waveguide is necessary. Therefore, the longitudinal and lateral modes both need to be in single mode. The constitution of the present invention is ideal for application to a wavelength conversion element.

FIG. 6 is a diagram of the structure of the coherent light source in this embodiment. In FIG. 6*a*, a wide stripe semiconductor laser 401 is directly coupled to a tapered waveguide 402. Light from the semiconductor laser 401 passes through the tapered waveguide 402 and is coupled to a single-mode waveguide 404. A Bragg reflection grating 405 is formed in the single-mode waveguide 404, and light that has undergone wavelength selection is fed back to the semiconductor laser 401. As a result, the semiconductor laser 401 oscillates in single longitudinal mode and single lateral mode and is efficiently coupled to the single-mode waveguide 404. A periodic polarization inversion structure 406 is formed in the single-mode waveguide 404, and light not reflected by the Bragg reflection grating 405 is converted by the polarization inversion structure 406 into a second harmonic wave whose wavelength is one-half that of the emitted light. For instance, if a semiconductor laser with a wavelength of 880 nm is driven at 500 mW, the light converted by the wavelength conversion element will be blue light of 440 nm and about 300 mW.

A structure such as this can be applied to several different systems. For instance, the position of the Bragg reflection grating in FIG. 6*a* may be behind the polarization inversion structure 406 or in the vicinity of the exit end face. In this case, the light of the semiconductor laser will be transmitted through more polarization inversion components, which is favorable in that it increases conversion efficiency.

As shown in FIG. 6*b*, the polarization inversion structure 406 can also be used as a Bragg reflection grating. A polarization inversion structure forcibly inverts the direction of crystals by the application of a high voltage, but a slight change in the refractive index occurs here as a result of residual strain in the polarization walls. This characteristic can be utilized, and a polarization inversion structure utilized as a periodic refractive index change, to constitute a Bragg reflection grating. In this case, though, a phase matching wavelength for wavelength conversion has to be matched with the Bragg wavelength, so only certain conversion wavelengths can be used.

It is also possible to use the fiber grating shown in FIG. 6c as a wavelength selecting filter. Very precise wavelength control is possible with a fiber grating, and the oscillation wavelength of a semiconductor laser can be controlled by controlling the temperature of the grating portion 408 formed in fiber 407. This allows the oscillation wavelength of the semiconductor laser to be adjusted to the phase matching wavelength of the wavelength conversion element. If more distance is kept from the fiber 407, the heat will not be conducted and the wavelength can be controlled stably. Another advantage is that light that has undergone wavelength conversion can be taken off from the fiber 407.

A structure that makes use of a band pass filter 510 such as that shown in FIG. 7 can also be used. Here, the band pass filter 510 is a narrow-band band pass filter, and one with a transmission wavelength width of about 0.2 µm and a transmissivity of about 80% can be obtained. Using a narrow-band filter is disadvantageous in terms of achieving a more compact size as compared to integrating the components, but an advantage is easier adjustment. The band pass filter 510 may also be a multilayer film.

Figures 7A, 7B:
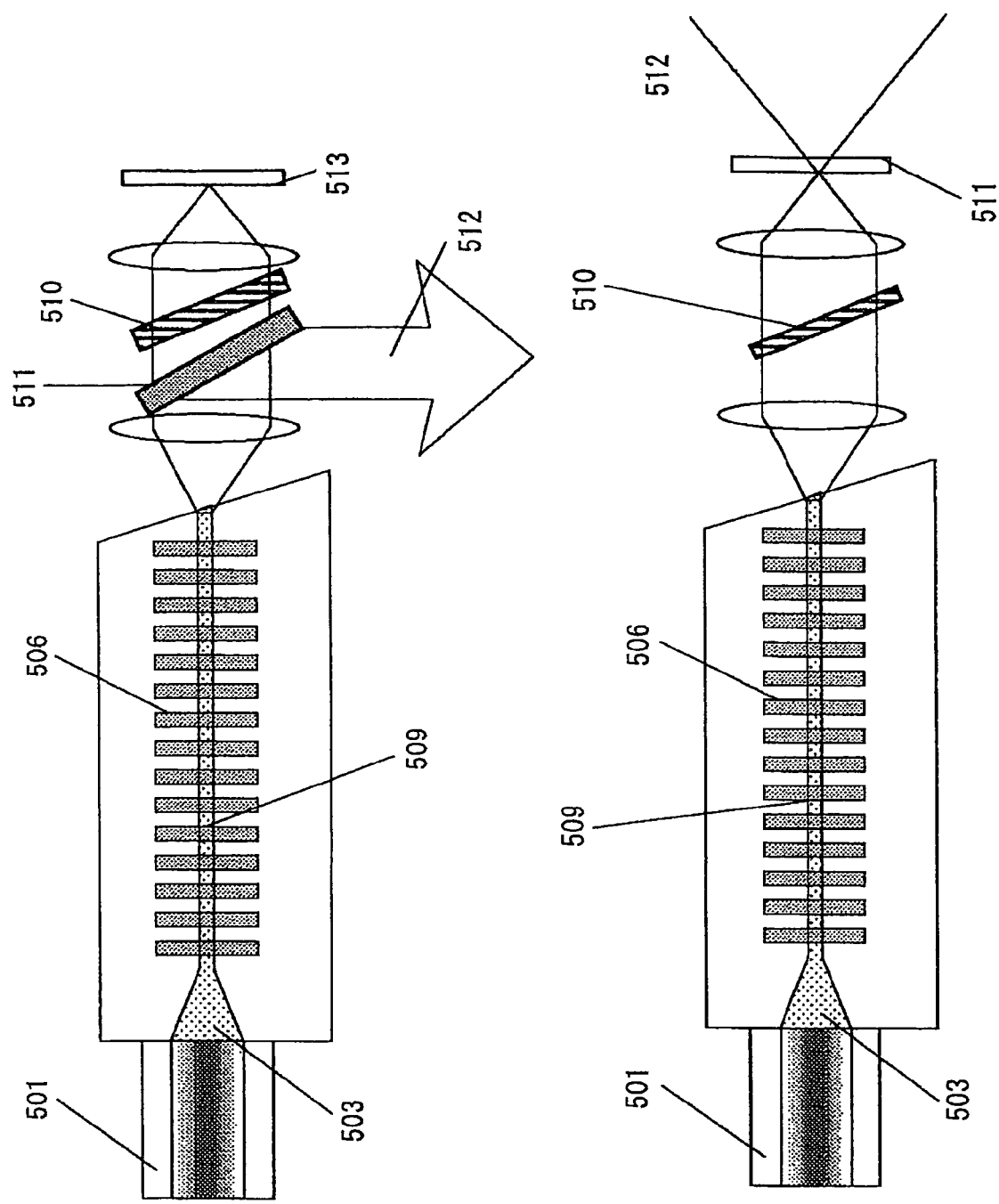
FIG. 7 consists of diagrams of structural examples of the coherent light source pertaining to a third embodiment of the present invention.

First, the structure in FIG. 7a will be described. The light that has exited a semiconductor laser 501 with a wavelength of 880 nm is coupled to a single-mode waveguide 509 through a tapered waveguide 503. The light coupled to the single-mode waveguide 509 is converted to a higher harmonic wave by a periodic polarization inversion structure 506. The light that is not converted is emitted from the single-mode waveguide 509, passes through a band pass filter 510, and is reflected by a dichroic mirror 511. The band pass filter 510 has a transmissivity of at least 80% at a wavelength of 880 nm±0.1 nm with respect to a fundamental wave. Meanwhile, the dichroic mirror 511 transmits 95% of light of 880 nm, and reflects at least 95% of light of 440 nm. Accordingly, a higher harmonic wave is reflected by the dichroic mirror 511 and emitted as a higher harmonic wave 512. Meanwhile, a fundamental wave with a wavelength of 880 nm is subjected to wavelength selection by the band pass filter 510, after which it is reflected by a reflector 513, and then goes back along the same path and is fed back to the active layer of the semiconductor laser 501. The longitudinal and lateral modes are both selected by the tapered waveguide 503 and the band pass filter 510, which fixes the semiconductor laser 501 to single mode for both the longitudinal mode and the lateral mode, and affords stable and highly efficient coupling with the single-mode waveguide 509. The oscillation wavelength of a semiconductor laser for converting at high efficiency must be adjusted to the phase matching wavelength, but the transmission wavelength of the filter can be varied by varying the angle of the band pass filter 510. The output of the semiconductor laser was 500 mW and the coupling efficiency was 60%, and an output of 150 mW was obtained as a higher harmonic wave. Because wavelength stability and coupling stability were excellent, stable high-output conversion was possible.

Next, the structure in FIG. 7b will be described. Here, the structure in FIG. 7a is further simplified, which reduces the number of components and gives a simpler optical system. The light that exits the semiconductor laser 501 with a wavelength of 880 nm is coupled to the single-mode waveguide 509 through the tapered waveguide 503. The coupled light is converted to a higher harmonic wave by the periodic polarization inversion structure 506. The light that is not converted is emitted from the optical waveguide, goes through the band pass filter 510, and is reflected by the dichroic mirror 511. The band pass filter 510 has a transmissivity of at least 80% at a wavelength of 880 nm±0.1 nm with respect to a fundamental wave, and has a transmissivity of at least 85% with respect to a higher harmonic wave with a wavelength of 440 nm. The dichroic mirror 511 reflects 99% of higher harmonic waves with a wavelength of 440 nm, and transmits at least 95% of light of 440 nm. Accordingly, a higher harmonic wave is transmitted through the band pass filter 510 and the dichroic mirror 511 and emitted as a higher harmonic wave 512. Meanwhile, a fundamental wave with a wavelength of 880 nm is subjected to wavelength selection by the band pass filter 510, after which it is reflected by the dichroic mirror 511 and is again incident on the optical waveguide 509 and is fed back to the active layer of the semiconductor laser 501. The longitudinal and lateral modes are both selected by the tapered waveguide 503 and the band pass filter 510, which fixes the semiconductor laser 501 to single mode for both the longitudinal mode and the lateral mode, and affords stable and highly efficient coupling with the single-mode waveguide 509. The output of the semiconductor laser was 500 mW and the coupling efficiency was 60%, and an output of 120 mW was obtained as a higher harmonic wave. The number of components was also reduced, and because the optical system was a linear optical system, it easy to adjust, and was compact and stable.

Fourth Embodiment

FIG. 8 consists of diagrams of examples of other coherent light sources of the present invention.

Here, a Bragg reflection grating was integrated as a wavelength selecting filter into a semiconductor laser. Integrating a Bragg reflection grating into a semiconductor laser enhances the effect of the Bragg diffraction, so the output of the semiconductor laser can be modulated faster.

Figure 8A:
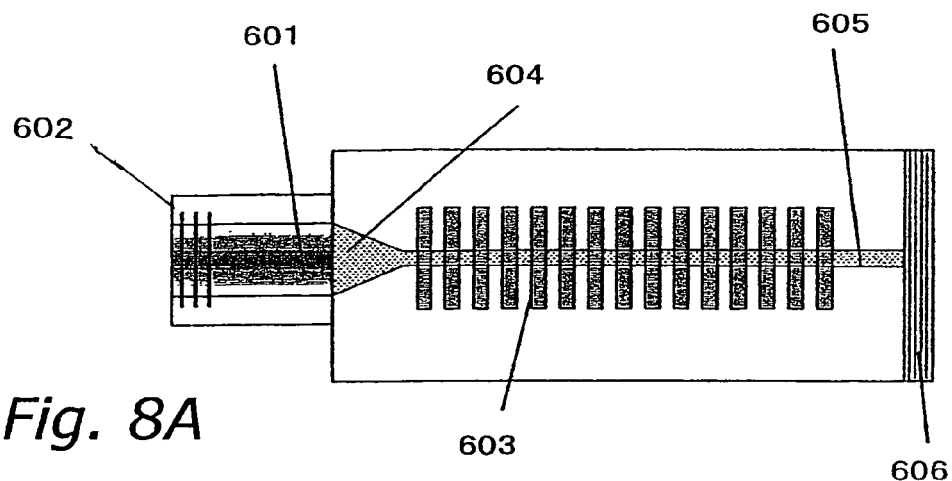
FIG. 8 consists of diagrams of structural examples of the coherent light source pertaining to a fourth embodiment of the present invention.

In FIG. 8a, the light that exits a wide stripe semiconductor laser 601 is coupled to a single-mode waveguide 605 through a tapered waveguide 604. The light that propagates through the single-mode waveguide 605 is converted into a higher harmonic wave by a periodic polarization inversion structure 603. A reflective film 606 formed on the end face of the waveguide 605 is made of a dielectric multilayer film, and is designed to transmit at least 95% of higher harmonic wave and reflect at least 80% of fundamental waves. The reflected fundamental wave is recoupled to the active layer of the semiconductor laser 601. Wavelength selection is performed by a Bragg reflection grating 602 provided to the semiconductor laser 601, and the mode is selected by the single-mode waveguide 605 and the tapered waveguide 604, the result of which is that the semiconductor laser 601 oscillates in single mode for both the lateral mode and the longitudinal mode. This allows high efficiency wavelength conversion to be achieved. Also, because the structure is so simple, it can be easily made smaller, and stability is high.

Figure 8B:
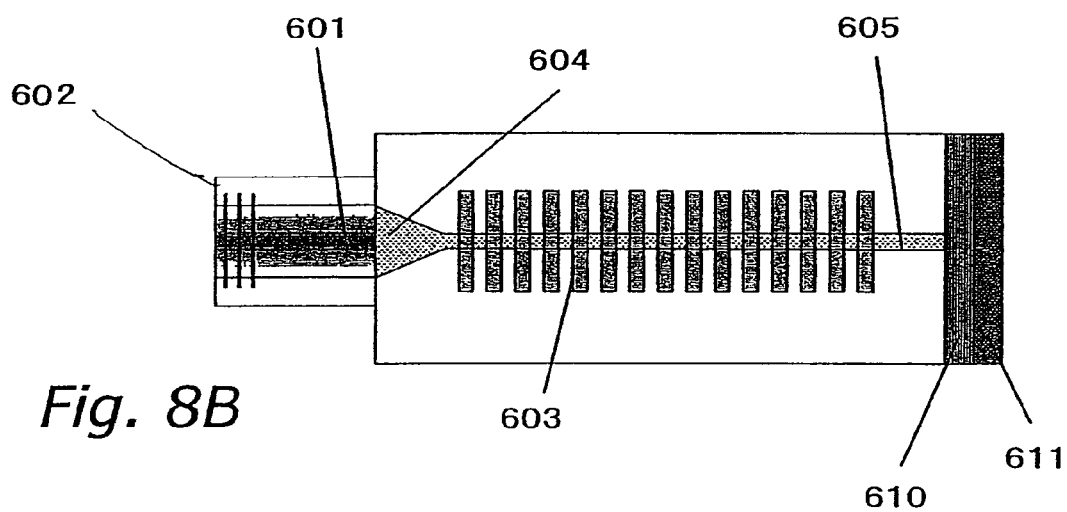
Figure 8C:
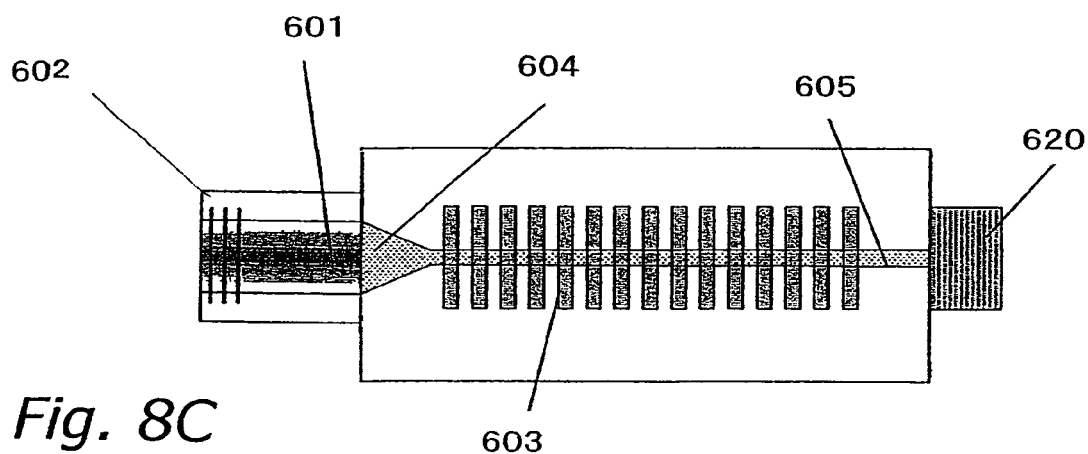

Furthermore, the coherent light source may be structured as shown in FIG. 8b, in which a band pass filter 610 and a dichroic mirror 611 are formed on the end face of the waveguide 605, or structured as shown in FIG. 8c, in which a volume grating 620 is formed on the waveguide end face.

As discussed above, high-speed output modulation is also possible by integrating a grating into a semiconductor laser.

Fifth Embodiment

FIG. 9 consists of diagrams of examples of other coherent light sources of the present invention.

Figure 9A:
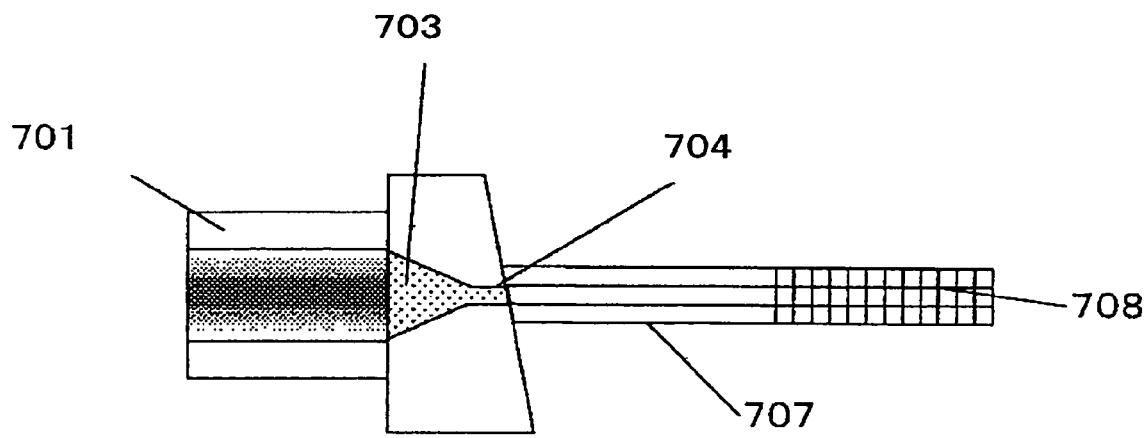
FIG. 9 consists of diagrams of structural examples of the coherent light source pertaining to a fifth embodiment of the present invention.
Figure 9B:
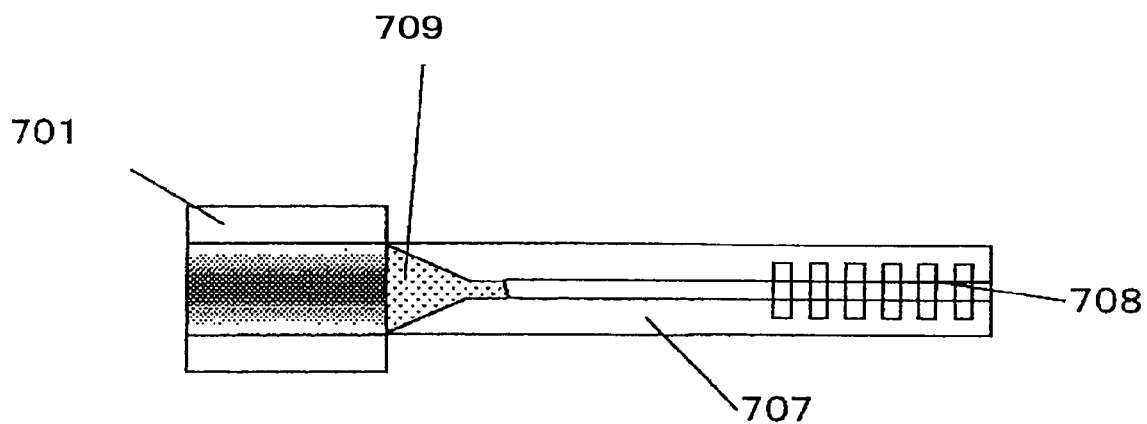

The structure here involves using a fiber grating in which a Bragg reflection grating is formed. FIG. 9a shows a structure in which a single-mode fiber 707 is coupled to a wide stripe semiconductor laser 701 through a tapered waveguide 703 and a single-mode waveguide 704. A Bragg reflection grating 708 is formed in the fiber 707, and reflected light from the Bragg reflection grating 708 is fed back to the semiconductor laser 701. This feedback light fixes the lateral mode and longitudinal mode of the semiconductor laser 701 in single mode. As shown in FIG. 9b, a tapered fiber 709 can be used in the similar way. The output of the semiconductor laser 701 can be from the fiber side or from the read end face of the semiconductor laser.

Sixth Embodiment

A laser display will be described here as an optical device that makes use of the coherent light source of the present invention.

Figure 10:
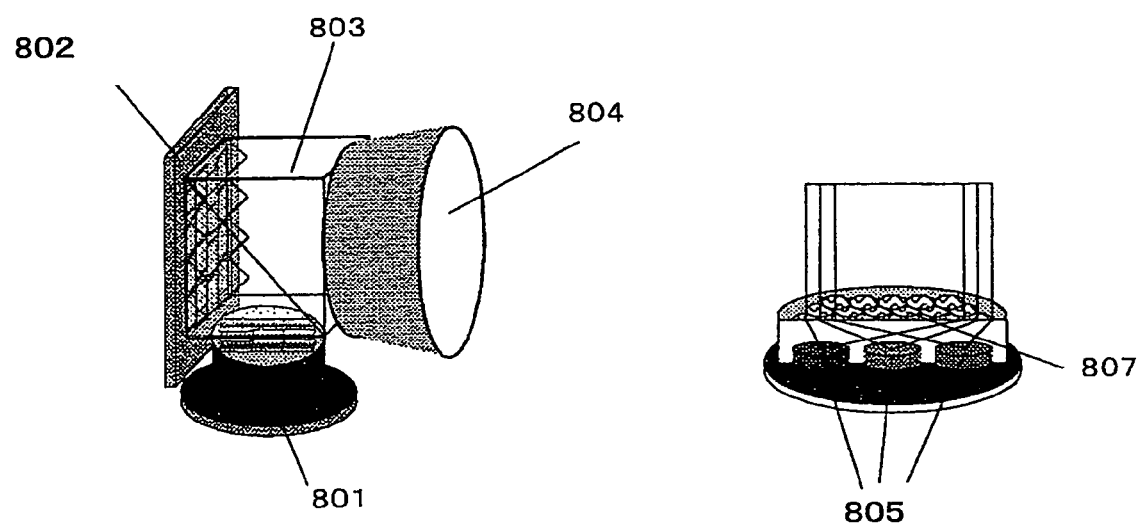
FIG. 10 is a diagram of an example of the optical device pertaining to the present invention.

With a laser display, a display of high color reproducibility can be achieved by using an RGB laser 805 and diffraction element 807 (FIG. 10). High-output red semiconductor lasers have been developed as laser light sources. An increase in output has not been achieved with blue, however, and the very formation of a semiconductor laser is difficult with green. In view of this, it is necessary to use blue and green light sources that utilize wavelength conversion. In the coherent light source of the present invention, since a wide stripe semiconductor laser can be used, high-output blue and green light can be obtained by combining with a wavelength conversion element. For blue output, blue light of 440 nm can be obtained by subjecting a semiconductor laser of 880 nm to wavelength conversion, and for green output, green light of 530 nm can be obtained by subjecting a semiconductor laser of 1060 nm to wavelength conversion.

A two-dimensional image can be projected by integrating these light sources, projecting onto a two-dimensional switch 802 through a prism 803, and projecting the switched light source 801 onto a screen with a lens 804 (FIG. 10). The two-dimensional switch 802 can be an MEMS involving micromachines, or a liquid crystal switch, or the like. While it varies with the screen size, the required output is from a few dozen milliwatts to a few hundred milliwatts. As discussed above, the coherent light source of the present invention affords a compact short-wavelength light source, and allows a compact and highly efficient laser display to be obtained.

Figure 11:
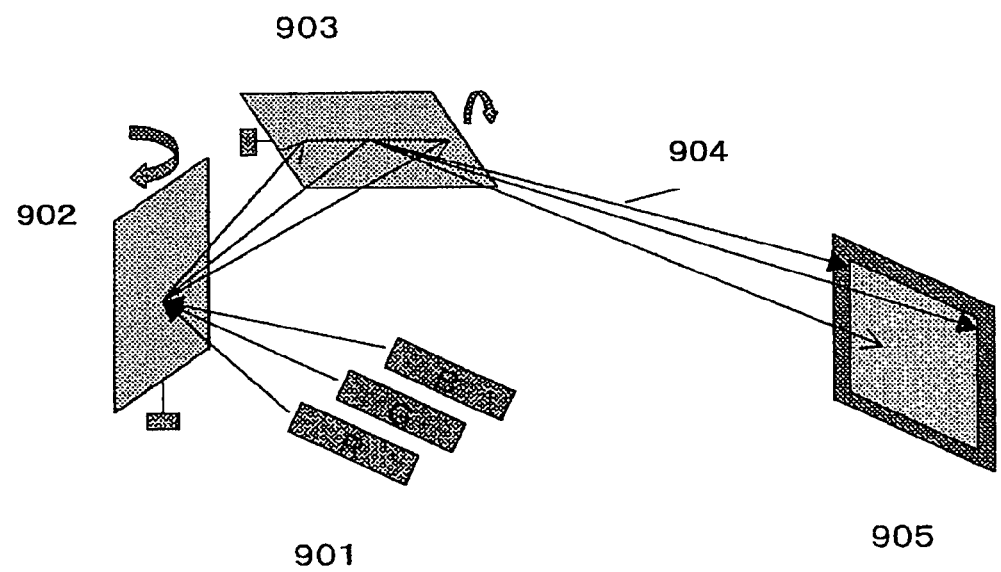
FIG. 11 is a diagram of another example of the optical device pertaining to the present invention.

The system shown in FIG. 11 is also effective as a laser display device. A two-dimensional image is drawn on a screen 905 by scanning a laser beam 904 with reflectors 902 and 903. In this case, the laser light source 901 must have a high-speed switching function, and high-speed output modulation is possible by modulating the output of the semiconductor laser. The coherent light source of the present invention allows for higher output and is promising in laser display applications. Also, even though it is a wide stripe laser involving optical feedback, since both the vertical mode and the lateral mode are fixed in single mode, output modulation of the laser can be performed at high speed. This allows a scanning type of laser display to be obtained.

Embodiments of the present invention were described above by giving examples of using an SHG element for a waveguide type of optical device. With a light source that makes use of an SHG element, since a high-output semiconductor laser is often used as the semiconductor laser, if a wide stripe semiconductor laser could be used as a high-output laser, a compact high-output light source could be achieved. Accordingly, using the structure of the present invention affords higher output and better stability.

The waveguide type of optical device is not limited to an SHG element, however. For example, various functions and constitutions are conceivable as the waveguide type of optical device, such as a high-speed modulation element, phase shifter, frequency shifter, or polarization control element. The waveguide type of optical device of the present invention can be applied to all optical systems that make use of a coherent light source and a waveguide type of optical device such as this.

Also, a laser display was described as an example of an optical device, but the present invention is also effective with optical disk devices and measurement devices. The present invention is particularly effective with an optical disk device, since it needs to have higher laser output through higher write speed. Furthermore, it is essential that a laser beam be in single mode since convergence characteristics at the diffraction limit are needed. Because it has high output and high coherence, the light source of the present invention can be more compact, and is effective when applied to optical disks and the like.

As discussed above, the coherent light source of the present invention allows the lateral mode and longitudinal mode of a wide stripe laser to be fixed in single-mode oscillation by adding wavelength selection and mode selection of a wide stripe laser, whose output is easy to raise, and then feeding back the light. This affords a high-output single-mode oscillation laser.

INDUSTRIAL APPLICABILITY

A high-output single-mode oscillation laser has excellent convergence characteristics and high coherence, so convergence is possible up to the diffraction limit, and this laser can be applied to optical disks, measurement devices that utilize laser working or the diffraction of light, and various kinds of optical device that utilize single-mode waveguides.

Furthermore, if the high-output laser of the present invention is used along with a wavelength conversion element, a highly efficient, high-output, short-wavelength light source that utilizes high-output characteristics can be obtained.

Also, the use of the coherent light source of the present invention affords a high-output, compact RGB light source, so this light source can be applied not only to laser displays, but to various other optical devices such as optical disk devices.

The invention claimed is:

1. A coherent light source comprising:
   a wide stripe semiconductor laser capable of exciting a plurality of lateral modes;
   a mode converter for beam shaping therein light emitted from the semiconductor laser and for controlling the lateral modes;
   a single-mode waveguide to which the light from the semiconductor laser is coupled through the mode converter; and
   a wavelength selecting filter through which light exciting an end face of the single-mode wavelength passes, and through which a portion of the light transmitted by the single-mode waveguide simultaneously undergoes wavelength selection and mode selection and is fed back to an active layer of the semiconductor laser using the same exit path, wherein an oscillation mode of the semiconductor laser is limited by the light that has been fed back, so that the semiconductor laser oscillates in a generally single longitudinal mode and generally single lateral mode, wherein the portion of the light coupled to the single-mode waveguide is also reflected at the end face of the single-mode waveguide and fed back to the active layer of the semiconductor laser, and wherein the single-mode waveguide is composed of a non-linear optical material and has a periodic polarization inversion structure, and a portion of the light from the semiconductor laser is subjected to wavelength conversion by the polarization inversion structure;

wherein an oscillation wavelength of the semiconductor laser is fixed such that [n2−n1]/n1 is between 0.2% and 0.5% inclusive, n1 being a refractive index of the wavelength selecting filter with respect to the light with a wavelength λ and n2 being a refractive index of the wavelength selecting filter with respect to the light of a wavelength λ/2.

2. A coherent light source comprising:

a wide stripe semiconductor laser;

a mode converter for beam shaping therein light emitted from the semiconductor laser and for controlling the lateral modes a single-mode waveguide to which the light from the semiconductor laser is coupled through the mode converter; and a wavelength selecting filter through which a portion of the light transmitted by the single-mode waveguide is fed back to an active layer of the semiconductor laser and simultaneously undergoes wavelength selection and mode selection, wherein the oscillation mode of the semiconductor laser is limited by the light that has been fed back, wherein the wavelength selecting filter includes a band pass filter and a reflector, and the light that has been transmitted by the single-mode waveguide passes through the band pass filter, and then the portion of the light that has been fed back through the wavelength selecting filter is reflected by the reflector and fed back to the active layer of the semiconductor laser, and wherein the single-mode waveguide is composed of a non-linear optical material and has a periodic polarization inversion structure, and a portion of the light from the semiconductor laser is subjected to wavelength conversion by the polarization inversion structure;

wherein an oscillation wavelength of the semiconductor laser is fixed such that [n2−n1]/n1 is between 0.2% and 0.5% inclusive, n1 being a refractive index of the wavelength selecting filter with respect to the light with a wavelength λ and n2 being a refractive index of the wavelength selecting filter with respect to the light of a wavelength λ/2.

3. The coherent light source according to claim 2, wherein the band pass filter and the reflector are formed integrally with the single-mode waveguide as a Bragg reflection grating.

4. The coherent light source according to claim 1, wherein the wavelength selecting filter is a volume grating.

5. The coherent light source according to claim 1, wherein the wavelength selecting filter is a fiber grating.

6. The coherent light source according to claim 1, wherein the wavelength selecting filter is formed integrally with the semiconductor laser as a Bragg reflection grating.

7. The coherent light source according to claim 1, wherein the mode converter is a tapered waveguide.

8. The coherent light source according to claim 1, wherein the mode converter is a tapered fiber.

9. A coherent light source, comprising:

a wide stripe semiconductor laser;

a mode converter for beam shaping light emitted from the semiconductor laser and for controlling the lateral modes;

a single-mode waveguide to which the light from the semiconductor laser is coupled through the mode converter; and a wavelength selecting filter through which a portion of the light transmitted by the single-mode waveguide is fed back to an active layer of the semiconductor laser and simultaneously undergoes wavelength selection and mode selection, wherein an oscillation mode of the semiconductor laser is limited by the light that has been fed back, wherein the single-mode waveguide has a polarization inversion structure, wherein the portion of the light from the semiconductor laser is subjected to wavelength conversion by the polarization inversion structure, and wherein an oscillation wavelength of the semiconductor laser is fixed such that (n2−n1)/n1 is between 0.2% and 0.5% inclusive, n1 being a refractive index of the wavelength selecting filter with respect to light with a wavelength λ and n2 being a refractive index of the wavelength selecting filter with respect to light with a wavelength λ/2.

10. A coherent light source comprising:

a wide stripe semiconductor laser capable of exciting a plurality of lateral modes;

a tapered waveguide having an incident end face to which light exiting from the semiconductor laser is coupled;

a single-mode waveguide formed on the end face side of the tapered waveguide;

a band pass filter through which a portion of the light transmitted by the single-mode waveguide passes; and a reflector that reflects the light transmitted through the band pass filter and feeds the portion of the light back to an active layer of the semiconductor laser using the same exit path, wherein the oscillation mode of the semiconductor laser is limited by the light that has been fed back, so that the semiconductor laser oscillates in a generally single longitudinal mode and a generally single lateral mode, and wherein the single-mode waveguide is composed of a non-linear optical material and has a periodic polarization inversion structure, and a portion of the light from the semiconductor laser is subjected to wavelength conversion by the polarization inversion structure;

wherein an oscillation wavelength of the semiconductor laser is fixed such that [n2−n1]/n1 is between 0.2% and 0.5% inclusive, n1 being a refractive index of the wavelength selecting filter with respect to the light with a wavelength λ and n2 being a refractive index of the wavelength selecting filter with respect to the light of a wavelength λ/2.

11. The coherent light source according to claim 10, wherein the band pass filter is formed integrally with the single-mode waveguide as a Bragg reflection grating.

12. A coherent light source:
a wide stripe semiconductor laser capable of exciting a plurality of lateral modes, including a Bragg reflection grating;
a tapered waveguide having an incident end face to which light from the semiconductor laser is coupled;
a single-mode waveguide formed on the exit end face side of the tapered waveguide; and
a reflector that reflects a portion of the light transmitted from the single-mode waveguide and feeds the portion of the light back to an active layer of the semiconductor laser using the same exit path,
wherein the oscillation mode of the semiconductor laser is limited by the light that has been fed back, so that the semiconductor laser oscillates in a generally single longitudinal mode and a generally single lateral mode, and
wherein the single-mode waveguide is composed of a non-linear optical material and has a periodic polarization inversion structure, and
a portion of the light from the semiconductor laser is subjected to wavelength conversion by the polarization inversion structure;
wherein an oscillation wavelength of the semiconductor laser is fixed such that [n2−n1]/n1 is between 0.2% and 0.5% inclusive, n1 being a refractive index of the wavelength selecting filter with respect to the light with a wavelength $\lambda$ and n2 being a refractive index of the wavelength selecting filter with respect to the light of a wavelength $\lambda/2$.

13. The coherent light source according to claim 12, wherein the exit end face of the single-mode waveguide has a dichroic mirror that transmits fundamental waves and transmits higher harmonic waves.

14. The coherent light source according to claim 1, wherein the lateral mode of the semiconductor laser is substantially fixed to single-mode oscillation by feedback light.

15. An optical device, having an image conversion optical system and the coherent light source according to claim 1, wherein the light from the coherent light source is converted by the optical system into a two-dimensional image.

16. The optical device according to claim 15, wherein the image conversion optical system has a two-dimensional beam scanning optical system.

17. The optical device according to claim 15, wherein the image conversion optical system has a two-dimensional switch.

18. The coherent light source according to claim 12, wherein the lateral mode of the semiconductor laser is substantially fixed to single-mode oscillation by feedback light.

19. An optical device, having an image conversion optical system and the coherent light source according to claim 12, wherein the light from the coherent light source is converted by the optical system into a two-dimensional image.

20. The optical device according to claim 19, wherein the image conversion optical system has a two-dimensional beam scanning optical system.

21. The optical device according to claim 19, wherein the image conversion optical system has a two-dimensional switch.

22. The coherent light source according to claim 10, wherein the lateral mode of the semiconductor laser is substantially fixed to single-mode oscillation by feedback light.

23. An optical device, having an image conversion optical system and the coherent light source according to claim 10, wherein the light from the coherent light source is converted by the optical system into a two-dimensional image.

24. The optical device according to claim 23, wherein the image conversion optical system has a two-dimensional beam scanning optical system.

25. The optical device according to claim 23, wherein the image conversion optical system has a two-dimensional switch.

* * * * *